United States Patent [19]

Wolski et al.

[11] Patent Number: 4,572,768

[45] Date of Patent: Feb. 25, 1986

[54] TREATMENT FOR COPPER FOIL

[75] Inventors: Adam M. Wolski, Edgewater Park; Chintsai T. Cheng, Hamilton Square; Richard B. Simon, Browns Mills; Manoj C. Gambhirwala, Edgewater Park, all of N.J.

[73] Assignee: Square D Company, Palatine, Ill.

[21] Appl. No.: 750,111

[22] Filed: Jun. 28, 1985

[51] Int. Cl.[4] .................. C25D 5/10; C25D 7/06
[52] U.S. Cl. ...................... 204/15; 156/151; 204/27; 204/40; 204/44.2; 428/626; 428/637; 428/658; 428/675; 428/686
[58] Field of Search .............. 156/151; 204/40, 15, 204/27; 428/626, 637, 658, 675, 680, 686

[56] References Cited

U.S. PATENT DOCUMENTS

| | | | |
|---|---|---|---|
| Re. 30,180 | 12/1979 | Wolski et al. | 428/601 |
| 3,857,681 | 12/1974 | Yates et al. | 204/40 X |
| 4,456,508 | 6/1984 | Torday et al. | 204/27 |
| 4,469,567 | 9/1984 | Torday et al. | 204/27 |

Primary Examiner—G. L. Kaplan
Attorney, Agent, or Firm—Donald P. Reynolds; Richard T. Guttman

[57] ABSTRACT

An improved treatment for copper foil that is to be used for lamination to a board comprises electrodepositing a dendritic layer of copper on the side of the foil that is to be laminated to the board. The dendritic layer is secured by electrodepositing a gilding layer of copper over it. A barrier layer is next electrodeposited over the gilding layer. The barrier layer is formed by means such as electrodeposition from a solution containing ions of zinc, nickel and antimony. This in turn is covered with an anticorrosion layer that is formed of chromates or phosphates, disposed over the barrier layer.

8 Claims, No Drawings

TREATMENT FOR COPPER FOIL

BACKGROUND OF THE INVENTION

This invention relates to the treatment of copper foil that is produced to be laminated to form printed circuits. In particular, it is a treatment that resists undercutting and produces a stable laminate bond under both normal and elevated temperatures.

In the production of printed electronic circuits, it is a common practice to bond metal foil to substrate material, generally a synthetic polymer, and to subject the composite structure to an acid etching treatment to form the desired circuit. Because the adhesion between conventional metal foil and such a substrate material is normally weak, considerable effort has been directed in the past to treating the foil so as to increase its bond strength with the substrate. As a result of such efforts, treatments have been developed which result in the enhancement of bond on one or both sides of the copper foil by electrodepositing a dentritic copper layer on its surface and gilding the dendritic layer so that when coated with a hardenable polymeric material the treated surface will, in effect, grip the polymer and form a tenacious bond.

While techniques such as the foregoing have succeeded in improving bond strength to some degree, problems have arisen in connection with the lamination of such treated foil to insulating substrates. More specifically, copper foil which has been provided with a "copper-type" treatment of the foregoing type tends, after etching to form the desired printed circuit, to leave traces of solid residue on the surface of the exposed insulating substrate. This residue is referred to in the trade as laminate staining or discoloration and is a highly undesirable effect. This laminate staining probably occurs because the matte (treated) side of the foil is subjected during the laminating process to contact with the softened resin. Chemical reactions apparently take place between the copper and the resin components, producing products which are not readily soluble in etching solutions used in printed circuit applications and which, accordingly, remain on the laminate surface, causing staining.

These problems are resolved by treating the copper foil so as to produce a matte surface formed of a plurality of copper electrodeposits having certain defined characteristics and coating the matte surface with a thin layer of zinc which, when heated during the laminating process, will form a brassy layer with the underlying copper. Such a layer provides the treated foil with good bond strength and renders the laminate made from it etchable in a single bath to produce the desired printed circuit with acceptable laminate color characteristics. It has been found that the desired characteristics will be achieved if the copper foil is subjected to a treatment which comprises the application to the foil of at least two separate electrodeposited copper layers, each succeeding electrodeposited layer having a different mechanical structure from a preceding electrodeposited layer to present a treated surface having physical properties different from those of the latter. In other words, this treatment involves a plurality of electrolytic copper treating operations carried out in a plurality of treating tanks, each one being carried out under separate electroplating conditions. The first treatment involves the electrodeposition on the copper foil of a nodular powdery copper layer which is coarse and rough and weakly adherent to the base copper foil, followed by a second treatment involving the application of an electrodeposited locking or gilding copper layer which is not nodular in structure but which conforms to the configuration of the first layer. The first treatment layer is supplied to increase the bond strength of the copper foil so that it can be more advantageously bonded to a substrate to form a laminate for use in electronic printed circuits. This first treatment step is capable of increasing the bond strength of one-ounce foil to range from 10 to 11 pounds per inch of width of laminate, depending upon the particular conditions utilized in this first treatment step. The amount of copper deposited in this first layer should be about 3–5 and preferably about 4 gms./m$^2$ of foil.

The second treatment step, that is, the application of the "locking" or "gilding" copper layer, does not reduce the bond strength supplied by the initial copper layer treatment, and ordinarily will increase such bond strength to about 12–13 lbs./In. of width of laminate. It does, however, reduce or eliminate the disadvantageous powder transfer characteristics which the foil otherwise would have as a result of the first treatment stage. The layer deposited in this second treatment stage should have a thickness such that this layer causes substantially no decrease in bond strength. For best results, the amount of copper deposited in this second step to achieve this goal should be about 3–7 and preferably about 5 gms./m.$^2$ of foil.

There is one other threat to the quality of a printed circuit that results from processes used in its manufacture. This is undercutting, which is the removal of the material under some or all of the foil that is protected by the photoresist that is applied to define the printed circuit. Removal of copper under the photoresist weakens bonding of the copper to the board. In extreme cases of undercutting, portions of the printed circuit may even become detached from the board. It is therefore necessary that the substances used to produce the gilding layer and the barrier layer withstand the etchant sufficiently to produce an acceptable amount of undercutting. Details of the processes described above are given in U.S. Pat. No. 3,857,681, "Copper Foil Treatment And Products Produced Therefrom," which is incorporated here by reference as if set forth fully.

If a copper foil is produced which laminates with a good bond, etches cleanly in all common etchants, resists staining during the lamination process, and undergoes zero or a negligible degree of undercutting during etching, one further problem awaits. Either finished board that is not etched or an etched board that has not yet had parts inserted may be stored to await further processing. During this storage, the exposed copper is subject to staining from oxygen, sulphur and other compounds in the atmosphere. It is therefore desirable to find a coating for the surface that resists tarnishing without impairing other desired properties of the surface.

SUMMARY OF THE INVENTION

It is an object of the present invention to provide an improved treatment for copper foil.

It is a further object of the present invention to provide a treatment for copper foil for use in printed circuits that reduces undercutting of the foil.

It is a further object of the present invention to provide a treatment for copper foil that produces an improved barrier layer.

Other objects will become apparent in the course of a detailed description of the invention.

An improved treatment for copper foil that is to be used for lamination to a board comprises electrodepositing a dendritic layer of copper on the side of the foil that is to be laminated to the board. The dendritic layer is secured by electrodepositing a gilding layer of copper over it. A barrier layer is next electrodeposited over the gilding layer. The barrier layer is formed by means such as electrodeposition from a solution containing ions of zinc, nickel and antimony. This in turn is covered with an anticorrosion layer that is formed of chromates or phosphates, disposed over the barrier layer.

DETAILED DESCRIPTION OF THE INVENTION

The present invention comprises applying a plurality of steps in the treatment of copper foil to produce a laminated circuit board with excellent bonding strength, good etchability in all commonly used etchants, resistance to staining, resistance to undercutting, and resistance to tarnishing. This invention can be practiced either with electrolytically deposited copper foil or with mechanically produced copper foil. In the latter case, the laminate bond tends to be significantly weaker. Electrolytically deposited copper foil has the advantage of having a matte surface and a shiny surface. The first step in treatment is to produce a dendritic layer of materials by electrodeposition on the matte surface. Copper is a preferred material for the dendritic layer. The dendritic layer is then gilded by electrodeposition of a layer of a material such as copper to secure the dendrites. These steps are well known and are disclosed in U.S. Pat. No. 3,857,681, incorporated here earlier be reference, and also U.S. Pat. No. 3,918,926, "Plural Copper-Layer Treatment Of Copper Foil And Articles Made Thereby" and its reissue, U.S. Pat. No. Re. 30,180. Both of these patents are also incorporated here by reference as if set forth fully.

The foil after the gilding process is next treated to form a barrier layer. This is preferably done by electroplating in a bath that contains ionic zinc, nickel and antimony. Several examples follow of conditions that have been used for electrodepositing a barrier layer.

EXAMPLE 1

The matte side of a sample of copper foil that has been treated to grow a dendritic layer which was then gilded was subjected to the following conditions for electrodeposition. A surface current density of 40 amperes per square foot was applied from an insoluble anode to the matte surface of the foil as a cathode. The current was passed through a solution that included the following constituents.

Zinc as sulphate: concentration 50 grams per liter.
Nickel as sulphate: concentration 2.5 grams per liter.
Antimony as potassium antimony tartrate: concentration 800 parts per million.

Temperature of the plating solution was maintained at approximately 27° C. and the pH of the solution was maintained at approximately 2.0 by the addition of zinc oxide or sulphuric acid. The plating time was about 10 seconds.

EXAMPLE 2

The matte side of a sample of copper foil that has been treated to grow a dendritic layer which was then gilded was subjected to the following conditions for electrodeposition. A surface current density of 80 amperes per square foot was applied from an insoluble anode to the matte surface of the foil as a cathode. The current was passed through a solution that included the following constituents.

Zinc as sulphate: concentration 50 grams per liter.
Nickel as sulphate: concentration 20 grams per liter.
Antimony as potassium antimony tartrate: concentration 1000 parts per million.

Temperature of the plating solution was maintained at approximately 27° C. and the pH of the solution was maintained at about 2.0 by the addition of zinc oxide or sulphuric acid. The plating time was about 10 seconds.

Successful results have been achieved by forming barrier layers with constituents and quantities over the ranges listed in Example 3.

EXAMPLE 3

Zinc as sulphate: from 20-100 grams per liter.
Nickel as sulphate: 1-70 grams per liter.
Antimony as potassium antimony tartrate: 600-1800 parts per million.
Surface current density: from 40-120 amperes per square foot.
Temperature: from 16°-38° C.
pH: from 1.5-3.5.
Anodes: insoluble.
Plating times: from 5-30 seconds.

Samples of foil produced by the processes of the Examples were tested for various properties in comparison with foil having barrier layers of pure zinc and of nickel and zinc. Each of the test specimens was bonded to a prepreg of glass fiber and epoxy resin, designated FR4 by the National Electrical Manufacturers' Association (NEMA), and also to a prepreg of glass fiber in a polyimide resin. The polyimide is cured at a higher temperature than the FR4, which requires more stability of the treatment. Resistance to undercutting was tested by etching a laminated foil to produce two lines of bonded copper, each 1 mm. wide. One of the lines was pulled from the prepreg by a force that was measured. The remaining line was subjected to a bath of hydrochloric acid for one-half hour, then pulled from the prepeg. The difference in the measured forces provided an indication of how the foil resisted undercutting. Measured results of Example 1 on FR-4 are given in the table.

TABLE

| Peel strength in pounds to pull off a 1 mm. strip. | | |
| --- | --- | --- |
| | Before HCl | After HCl |
| Zinc-antimony | 0.35 | 0.31 |
| Nickel-zinc | 0.47 | 0.37 |
| Nickel-zinc-antimony | 0.47 | 0.46 |

It can be seen from the table that a barrier layer of nickel, zinc, and antimony resists undercutting more than the barrier layers formed of nickel and zinc or of zinc and antimony.

The final step in preparing copper foil for bonding to a prepreg comprises applying a coating that reduces tarnishing. This is typically accomplished by electroplating in a bath containing chromates, phosphates, or both. Typical examples are shown in U.S. Pat. No. 3,625,844, entitled "Stainproofing Process And Products Resulting Therefrom," and U.S. Pat. No. 3,853,716, entitled "Electrolytic Copper Stainproofing Process," which is incorporated here by reference as if set forth fully. Use of this or any other of the well-known processes for reducing tarnishing, together with the process of the present invention to provide a better barrier layer, results in an improved copper foil.

We claim:

1. A method of treating copper foil comprising the steps of:
   a. electrodepositing a dendritic layer of copper on the foil;
   b. electrodepositing a gilding layer of copper over the dendritic layer to secure the dendritic layer to the foil;
   c. electrodepositing a barrier layer over the gilding layer, the barrier layer formed by electrodeposition from a barrier solution containing ions of zinc, nickel, and antimony; and
   d. electrodepositing a stainproofing layer on the barrier layer, the stainproofing layer formed by electrodeposition from a stainproofing solution containing chromate ions.

2. The method of claim 1 wherein the barrier solution comprises an aqueous solution of zinc, sulphate, nickel sulphate, and potassium antimony tartrate.

3. The method of claim 1 wherein the barrier solution comprises an aqueous solution of zinc sulphate at a concentration of from 20 to 100 grams per liter, nickel sulphate at a concentration of from 1 to 20 grams per liter, and potassium antimony tartrate at a concentration of from 600 to 1800 parts per million.

4. The method of claim 3 wherein the barrier solution is maintained at temperatures of from 16° C. to 38° C. and at a pH of from 1.5 to 3.5.

5. In the method of treating copper foil by electrodepositing a dendritic layer of copper on one side of the foil, electrodepositing a gilding layer of copper on the dendritic layer, electrodepositing a barrier layer over the gilding layer, and electrodepositing a stainproofing layer over the barrier layer, the improvement comprising electrodepositing the barrier layer from a solution containing ions of zinc, nickel, and antimony.

6. The method of claim 5 wherein the solution comprises an aqueous solution of zinc sulphate, nickel sulphate, and potassium antimony tartrate.

7. The method of claim 6 wherein the solution comprises an aqueous solution of zinc sulphate at a concentration of from 20 to 100 grams per liter, nickel sulphate at a concentration of from 1 to 20 grams per liter, and potassium antimony tartrate at a concentration of from 600 to 1800 parts per million.

8. The method of claim 7 wherein the solution is maintained at temperatures of from 16° C. to 38° C. and at a pH of from 1.5 to 3.5.

* * * * *